(12) United States Patent
Allen et al.

(10) Patent No.: US 8,809,156 B1
(45) Date of Patent: Aug. 19, 2014

(54) METHOD FOR IMPLEMENTING DEEP TRENCH ENABLED HIGH CURRENT CAPABLE BIPOLAR TRANSISTOR FOR CURRENT SWITCHING AND OUTPUT DRIVER APPLICATIONS

(71) Applicant: International Business Machines Corporation, Armonk, NY (US)

(72) Inventors: David H. Allen, Rochester, MN (US); Douglas M. Dewanz, Rochester, MN (US); David P. Paulsen, Dodge Center, MN (US); John E. Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/750,374

(22) Filed: Jan. 25, 2013

(51) Int. Cl.
*H01L 21/331* (2006.01)

(52) U.S. Cl.
USPC ......... 438/309; 438/361; 438/386; 438/E29.2

(58) Field of Classification Search
CPC ................... H01L 29/66333; H01L 29/66242; H01L 29/7397; H01L 29/7378
USPC .......... 438/138, 361, 309, 386; 257/328–329, 257/340–341, 488
See application file for complete search history.

(56) References Cited

U.S. PATENT DOCUMENTS

| | | | |
|---|---|---|---|
| 7,205,587 B2 | 4/2007 | Fujimaki | |
| 7,871,882 B2 | 1/2011 | Parthasarathy et al. | |
| 7,910,962 B2 | 3/2011 | Lu | |
| 8,247,287 B2 | 8/2012 | Parthasarathy et al. | |
| 8,530,967 B2 * | 9/2013 | Lee | 257/343 |
| 2010/0102375 A1 | 4/2010 | Aoi | |
| 2011/0115047 A1 | 5/2011 | Hebert et al. | |
| 2011/0304019 A1 | 12/2011 | Meunier-Beillard et al. | |
| 2012/0007176 A1 | 1/2012 | Kadow et al. | |

FOREIGN PATENT DOCUMENTS

JP 2007165635 A5 6/2007

* cited by examiner

*Primary Examiner* — Dung A. Le
(74) *Attorney, Agent, or Firm* — Joan Pennington

(57) ABSTRACT

A method and structures are provided for implementing deep trench enabled high current capable bipolar transistor for current switching and output driver applications. A deep oxygen implant is provided in a selected region of substrate. A first deep trench and second deep trench are formed above the deep oxygen implant. The first deep trench is a generally large rectangular box deep trench of minimum width and the second deep trench is a second small area deep trench centered within the first rectangular box deep trench. Ion implantation at relatively high ion pressure and annealing is utilized to form highly doped N+ regions or P+ regions both inside and outside the outside the first deep trench and around the outside the second deep trench region. These regions provide the collector and emitter respectively, and the existing substrate region provides the base region between the collector and emitter regions.

13 Claims, 6 Drawing Sheets

METHOD FOR IMPLEMENTING DEEP TRENCH ENABLED HIGH CURRENT CAPABLE BIPOLAR TRANSISTOR FOR CURRENT SWITCHING AND OUTPUT DRIVER APPLICATIONS

FIELD OF THE INVENTION

The present invention relates generally to the data processing field, and more particularly, relates to a method and structures for implementing deep trench enabled high current capable bipolar transistor for current switching and output driver applications.

DESCRIPTION OF THE RELATED ART

As integrated circuit logic circuit geometries continue to shrink, unfortunately a few structures continue to require a large area. Specifically, this invention targets power gating applications where extremely large area field effect transistors (FETs) are generally used to enable/disable power delivery and similarly extremely large area FETs are generally used in off chip output driver applications.

Electrostatic discharge circuits are taking ever larger subsets of the semiconductor die area. The power gating structures are area intensive, generally occupying 2% of the total area of the functional unit being power gated. The power gating FETs also have significant IR drop implications on the power rail supporting the function being power gated, typically on the order of 2% IR drop when one spends 2% of the total area on power gating.

A need exists for an effective mechanism and method of fabricating an enhanced transistor for current switching and output driver applications.

SUMMARY OF THE INVENTION

Principal aspects of the present invention are to provide a method and structures for implementing deep trench enabled high current capable bipolar transistor for current switching and output driver applications. Other important aspects of the present invention are to provide such method and structures substantially without negative effects and that overcome many of the disadvantages of prior art arrangements.

In brief, a method and structures are provided for implementing deep trench enabled high current capable bipolar transistor for current switching and output driver applications. A deep oxygen implant is provided in a selected region of substrate. A first deep trench and second deep trench are formed above the deep oxygen implant. The first deep trench is a generally large rectangular box deep trench of minimum width and the second deep trench is a second small area deep trench centered within the first rectangular box deep trench. Ion implantation at relatively high ion pressure is utilized to incorporate N+ dopants or P+ dopants on the exposed surfaces of each of the first deep trench and second deep trench. Subsequent annealing renders highly doped N+ regions or P+ regions both inside and outside the outside the first deep trench and around the outside the second deep trench region. These N+ regions or P+ regions provide the collector and emitter respectively, and the existing substrate region provides the base region between the collector and emitter regions.

In accordance with features of the invention, the bipolar transistor is current density optimized rather than being beta or gain optimized.

In accordance with features of the invention, forming a base contact, a collector contact, and an emitter contact includes high concentration implants for providing low resistance contacts.

In accordance with features of the invention, the deep oxygen implant forms an implanted silicon dioxide layer, which provides an etch stop for the deep trench etches.

In accordance with features of the invention, the deep oxygen implant includes a depth in a range of approximately 2-5 micrometers (μm).

In accordance with features of the invention, the first deep trench is a generally large rectangular box deep trench, for example, on the order of 1.0 μm on a side.

In accordance with features of the invention, collector current density is provided by using a base region width optimized for current density.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structures are provided for implementing deep trench enabled high current capable NPN or PNP bipolar transistor for current switching and output driver applications.

Figure 1:
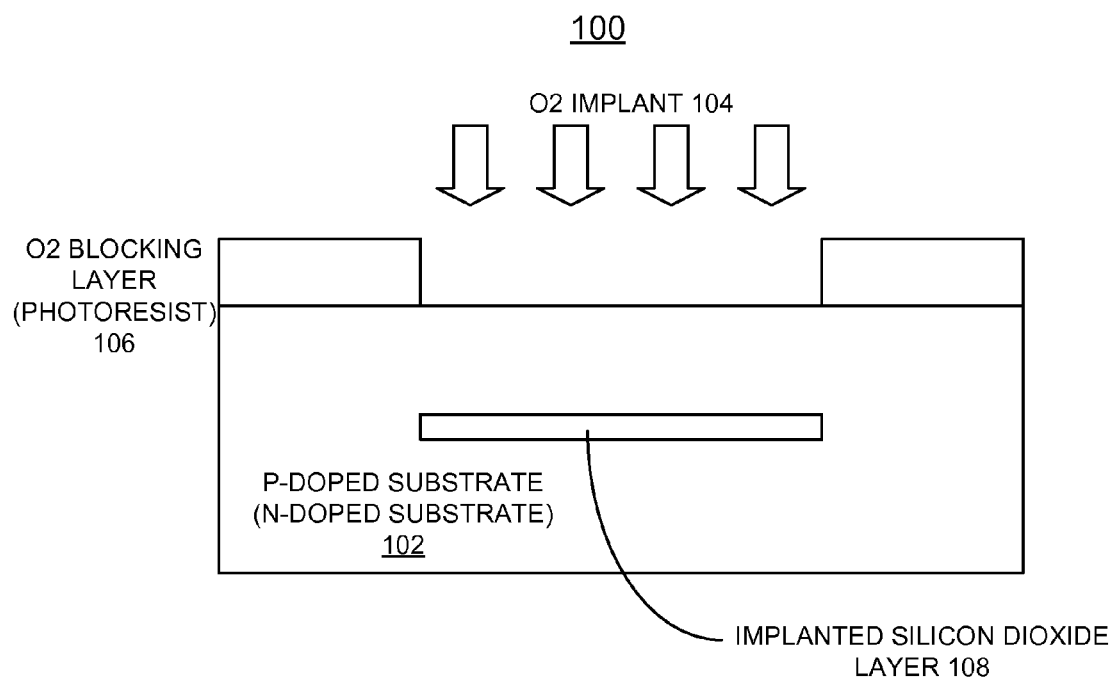
FIG. 1 is a schematic side plan view not to scale illustrating example processing steps for implementing a deep trench enabled high current capable bipolar transistor for current switching and output driver applications in accordance with the preferred embodiment.

Referring now to FIG. 1, there is schematically shown example processing steps generally designated by the reference character 100 for implementing a deep trench enabled high current capable bipolar transistor for current switching and output driver applications in accordance with the preferred embodiment. The deep trench enabled high current capable bipolar transistor is current density optimized rather than being beta or gain optimized.

In FIG. 1, in first processing steps 100, a semiconductor substrate 102 formed of a suitable material such as a silicon substrate 102 includes suitable doping, such as P-doped substrate 102 provided for fabricating a deep trench enabled high current capable NPN bipolar transistor. Alternatively, a substrate that is N-doped is provided for the substrate 102 for fabricating a deep trench enabled high current capable PNP bipolar transistor.

As shown in FIG. 1, an oxygen implant or O2 implant 104 through an O2 blocking layer or photo-resist 106 providing a deep oxygen implant 108 in a selected region of substrate 102 at a desired depth. A high O2 implant dose is assumed thereby creating a definitive SiO2 layer 108, for example, as deep as possible, such as ~2-5 µm, with considerations including silicon damage, implant dose, and the like.

Figure 2:
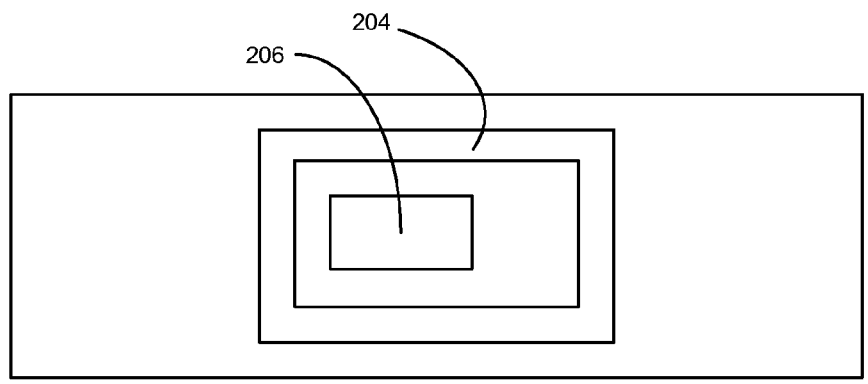
FIG. 2 is a schematic top plan view not to scale illustrating example processing steps for implementing the deep trench enabled high current capable bipolar transistor for current switching and output driver applications in accordance with the preferred embodiment.

FIG. 2 illustrates example processing steps generally designated by the reference character 200 for implementing the deep trench enabled high current capable bipolar transistor for current switching and output driver applications in accordance with the preferred embodiment. The processing steps 200 include patterning and etching steps 202 providing a first deep trench 204 and a second deep trench 206 formed above the deep oxygen implant 108 in FIG. 1. The implanted silicon dioxide layer 108 provides an etch stop for the deep trench etches 204, 206. The first deep trench 204 is a generally large, for example, on the order of 1.0 µm on a side, rectangular box deep trench of minimum width. The second deep trench 206 is a second small area deep trench centered within the first rectangular box deep trench 204. One can visualize this structure of trenches 204, 206 as a large picture frame surrounding a dot in the center of the framed image.

Figure 3:
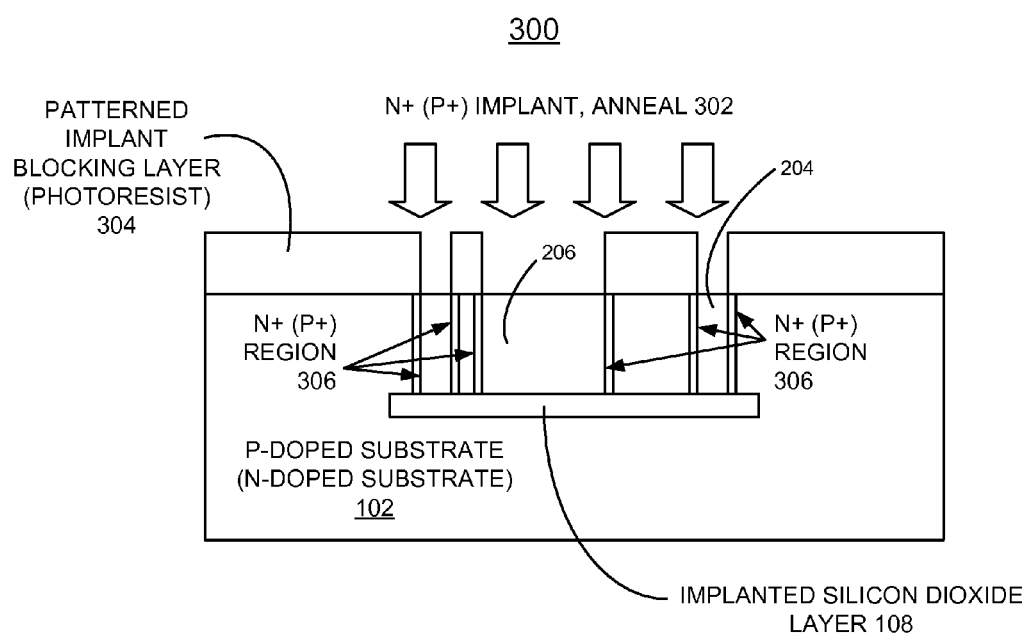
FIG. 3 is a schematic side plan view not to scale illustrating example processing steps for implementing a deep trench enabled high current capable bipolar transistor for current switching and output driver applications in accordance with the preferred embodiment.

Referring now to FIG. 3, there are shown example next processing steps generally designated by the reference character 300 for implementing a deep trench enabled high current capable bipolar transistor for current switching and output driver applications in accordance with the preferred embodiment. N+ ion implant and anneal steps 302 for fabricating a deep trench enabled high current capable NPN bipolar transistor include ion implantation at relatively high ion pressure that is utilized to incorporate N+ dopants on the exposed surfaces of each of the first deep trench and second deep trench through a patterned implant blocking layer or photo-resist 304. Subsequent annealing renders highly doped N+ regions 306 both inside and outside the first deep trench 204 and around the outside the second deep trench region 206. Alternatively for PNP bipolar transistor, P+ ion implant and anneal steps 302 form highly doped P+ regions 306 both inside and outside the first deep trench 204 and around the outside the second deep trench region 206 for fabricating a deep trench enabled high current capable PNP bipolar transistor.

Figure 4:
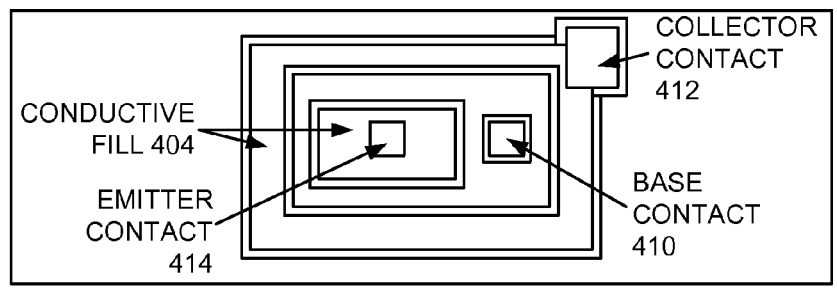
FIG. 4 is a schematic top plan view not to scale illustrating example processing steps for implementing the deep trench enabled high current capable bipolar transistor for current switching and output driver applications in accordance with the preferred embodiment.
Figure 5:
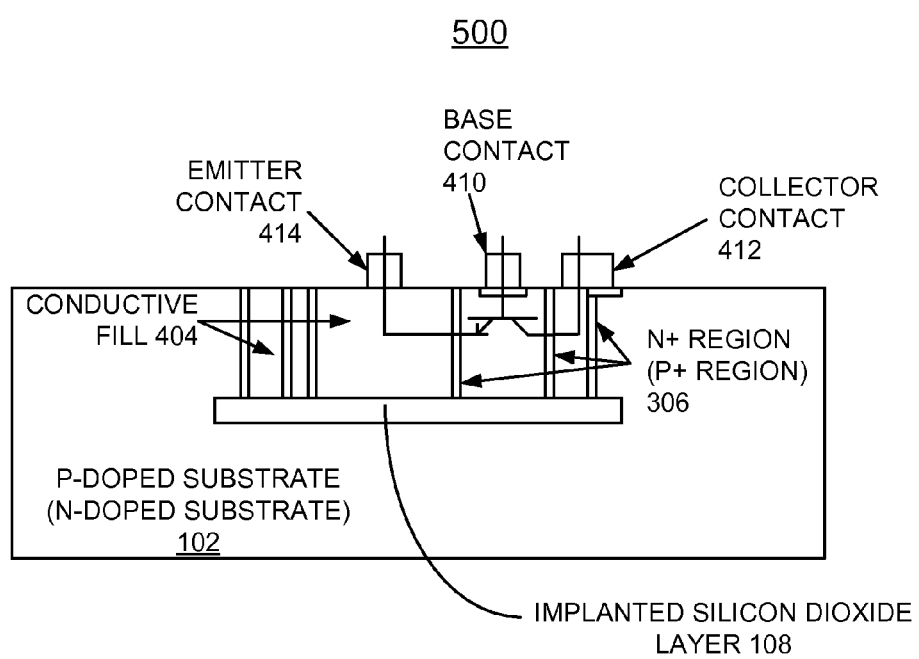
FIG. 5 is a schematic side plan view not to scale illustrating the deep trench enabled high current capable bipolar transistor for current switching and output driver applications with a final device schematic overlay in accordance with the preferred embodiment.

These N+ regions 306 or P+ regions 306 provide the collector and emitter respectively, and the existing substrate region provides the base region between the collector and emitter regions, as illustrated in FIGS. 4 and 5. For example, assuming a fairly wide base region, with a beta of around 20, current densities around 100 mA per $\mu m^2$ of collector are enabled. With 0.9 µm on each of the 3 sides of the collector at the collector-base interface and a collector/emitter depth of 3 µm one has 2.7 µm*3 µm of collector surface or 8.1 $\mu m^2$, or conservatively 800 mA of current sourcing capability.

In accordance with features of the invention, the deep trench enabled high current capable bipolar transistor of the invention provides improvements over conventional FETs for high current applications. A FET on the order of 1 mm of device width is required to source 800 mA of current. Drawing gates on a contacted pitch the planar FET would requires hundreds of square microns of surface to support that potential 800 mA power gated circuit load.

Referring now to FIG. 4, there are shown example next processing steps generally designated by the reference character 400 for implementing the deep trench enabled high current capable bipolar transistor for current switching and output driver applications in accordance with the preferred embodiment. Processing steps 402 include filling trenches 204, 206 with polysilicon or other suitable conductive fill 404, performing high concentration implants for low-resistance (low-R) contacts, and making a base contact 410, a collector contact 412, and an emitter contact 414. For example, desired concentrations include ~$1e21/cm^3$ for the emitter, $1e17^3$ base and $1e15/cm^3$ for the collector to base junction, $1e19/cm^3$ for the collector contact region.

FIG. 5 illustrates a final device schematic overlay for the example deep trench enabled high current capable bipolar transistor generally designated by the reference character 500 for current switching and output driver applications in accordance with the preferred embodiment. The collector contact 412, and the emitter contact 414 are shown with respective N+ regions 306 and conductive fill 404 and the base contact 410 is provided by the substrate P region between the collector and emitter N+ regions 306.

Figure 6:
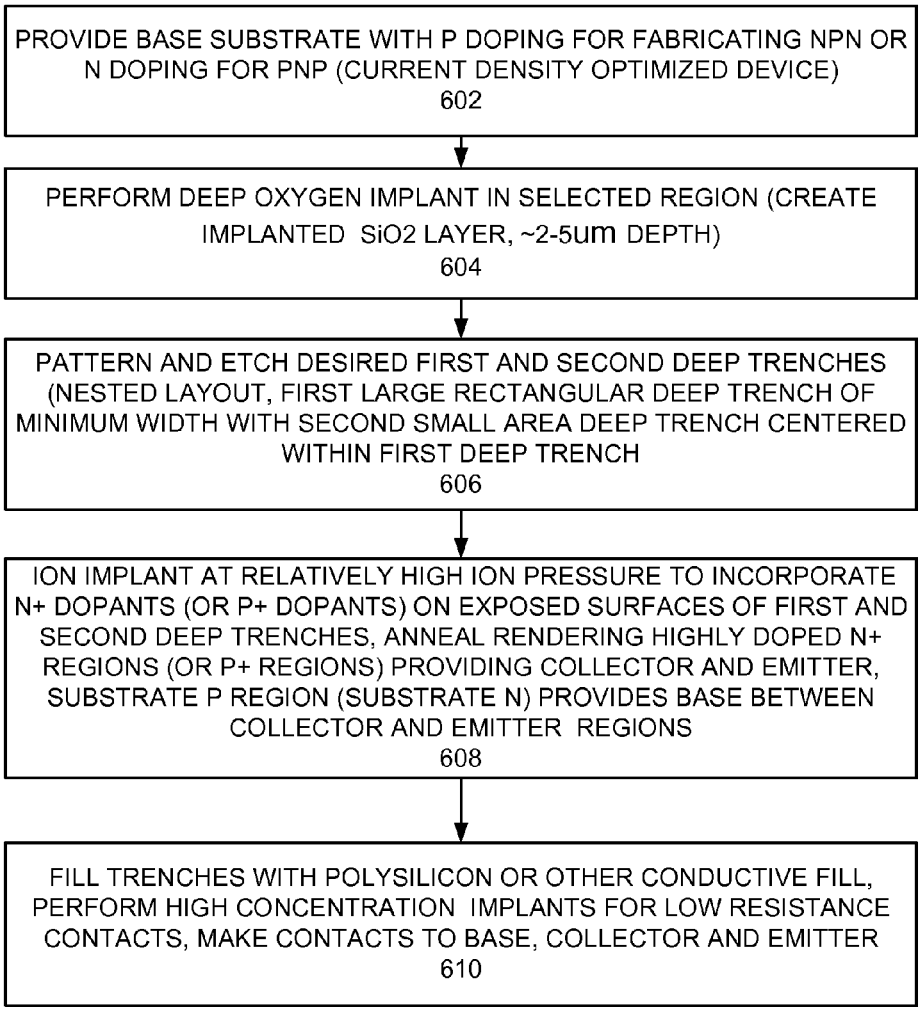
FIG. 6 is a flow chart illustrating exemplary processing steps for fabricating a deep trench enabled high current capable bipolar transistor for current switching and output driver applications in accordance with the preferred embodiment.

Referring now to FIG. 6, a flowchart illustrates exemplary processing steps generally designated by the reference character 600 for fabricating a deep trench enabled high current capable bipolar transistor for current switching and output driver applications in accordance with the preferred embodiment.

As indicated in a block 602, a base substrate is provided with p-doping for fabricating a deep trench NPN bipolar transistor for current switching and output driver applications. Alternatively, the base substrate is provided with n-doping for fabricating a deep trench PNP bipolar transistor for current switching and output driver applications at block 602. As indicated in a block 604, a deep oxygen implant is performed in a selected region of substrate, creating a definitive SiO2 layer 108. Patterning and etching define a first deep trench 204 and a second deep trench 206 that are formed above the deep oxygen implant 108 with the first deep trench being a generally large rectangular box deep trench of minimum width and the second deep trench being a second small area deep trench centered within the first rectangular box deep trench as indicated in a block 606.

Next as indicated in a block 608, an ion implant at relatively high ion pressure is utilized to incorporate N+ dopants or P+ dopants on the exposed surfaces of each of the first deep trench and second deep trench and subsequent annealing renders highly doped N+ regions or highly doped P+ regions both inside and outside the outside the first deep trench 204 and around the outside the second deep trench region 206. The N+ regions or P+ regions formed at block 608, provide the collector and emitter respectively, and the existing substrate region provides the base region between the collector and emitter regions.

As indicated in a block 610, the trenches 204, 206 are filled with polysilicon or other conductive fill, high concentration implants are provided for low resistance contacts, with a P+ implantation to allow a low resistance base contact for the NPN bipolar transistor or an N+ implantation to allow a low resistance base contact for the PNP bipolar transistor, and a base contact 410, a collector contact 412, and an emitter contact 414 are formed.

While the present invention has been described with reference to the details of the embodiments of the invention shown in the drawing, these details are not intended to limit the scope of the invention as claimed in the appended claims.

What is claimed is:

1. A method for implementing a deep trench enabled high current capable bipolar transistor comprising:

providing a deep oxygen implant in a selected region of a substrate;

forming a first deep trench and a second deep trench above the deep oxygen implant; said first deep trench being a generally large rectangular box deep trench of minimum width and said second deep trench being a second small area deep trench centered within the first rectangular box deep trench, wherein providing a deep oxygen implant includes creating an etch stop for said first deep trench and said second deep trench;

providing highly doped regions both inside and outside of the first deep trench and around an outside of the second deep trench;

providing a collector and an emitter respectively with said highly doped regions, and provides a base region with a substrate region between said collector and said emitter regions.

2. The method as recited in claim 1 wherein providing a deep oxygen implant in a selected region of a substrate includes providing a blocking photo-resist layer and providing said deep oxygen implant.

3. The method as recited in claim 2 includes creating a SiO2 layer at a depth in a range of approximately 2-5 micrometers (μm).

4. The method as recited in claim 1 includes creating a current density optimized bipolar transistor, and selectively providing current sourcing capability for the deep trench enabled high current capable bipolar transistor.

5. The method as recited in claim 1 includes providing a P-doped substrate and providing highly doped N+ regions for creating an NPN current density optimized bipolar transistor.

6. The method as recited in claim 5 includes selectively providing a base region width providing a collector-base interface area and selectively providing a deep trench depth providing a collector-emitter depth for a predefined collector current sourcing capability.

7. The method as recited in claim 1 includes providing a N-doped substrate and providing highly doped P+ regions for creating an PNP current density optimized bipolar transistor.

8. The method as recited in claim 7 includes selectively providing a base region width providing a collector-base interface area and selectively providing a deep trench depth providing a collector-emitter depth for a predefined collector current sourcing capability.

9. The method as recited in claim 1 wherein providing said highly doped regions includes patterning a blocking photo-resist layer and providing an ion implantation at relatively high ion pressure to incorporate dopants on exposed surfaces of the first deep trench and the second deep trench.

10. The method as recited in claim 9 includes annealing the dopants to render highly doped regions both inside and outside the outside the first deep trench and around the outside the second deep trench.

11. The method as recited in claim 10 further includes filling the first deep trench and the second deep trench with a selected conductive fill.

12. The method as recited in claim 11 includes forming a base contact, a collector contact, and an emitter contact.

13. The method as recited in claim 12 includes performing high concentration implants for providing low resistance contacts.

* * * * *